United States Patent
Edwards et al.

(10) Patent No.: US 11,429,757 B2
(45) Date of Patent: Aug. 30, 2022

(54) SENSOR CALIBRATION VIA EXTRINSIC SCANNING

(71) Applicant: GM Cruise Holdings LLC, San Francisco, CA (US)

(72) Inventors: Zachary Edwards, Oakland, CA (US); David Tran, San Francisco, CA (US); Matthew Jones, Oakland, CA (US)

(73) Assignee: GM Cruise Holdings LLC, San Francisco, CA (US)

( * ) Notice: Subject to any disclaimer, the term of this patent is extended or adjusted under 35 U.S.C. 154(b) by 0 days.

(21) Appl. No.: 16/992,231

(22) Filed: Aug. 13, 2020

(65) Prior Publication Data

US 2022/0050934 A1 Feb. 17, 2022

(51) Int. Cl.
*G06F 30/10* (2020.01)
*G01S 7/497* (2006.01)
*G06T 7/80* (2017.01)
*G01S 17/89* (2020.01)

(52) U.S. Cl.
CPC ........... *G06F 30/10* (2020.01); *G01S 7/497* (2013.01); *G01S 17/89* (2013.01); *G06T 7/80* (2017.01); *G06T 2207/30252* (2013.01); *G06T 2219/2004* (2013.01)

(58) Field of Classification Search
None
See application file for complete search history.

(56) References Cited

U.S. PATENT DOCUMENTS

| | | | | |
|---|---|---|---|---|
| 9,201,424 | B1* | 12/2015 | Ogale | G06T 7/80 |
| 2019/0172225 | A1* | 6/2019 | Park | G01C 21/3602 |
| 2020/0074675 | A1* | 3/2020 | Cejka | H04N 5/23299 |
| 2020/0284913 | A1* | 9/2020 | Amelot | G01S 7/4808 |
| 2021/0041371 | A1* | 2/2021 | Grauzinis | G01N 21/9515 |
| 2021/0255211 | A1* | 8/2021 | Szilágyi | G01P 13/00 |

* cited by examiner

*Primary Examiner* — Jeffrey J Chow
(74) *Attorney, Agent, or Firm* — Polsinelli, PC

(57) ABSTRACT

The subject technology provides solutions for performing extrinsic sensor calibration for vehicle sensors, such as environmental sensors deployed in an autonomous vehicle (AV) context. In some aspects, the disclosed technology relates to a sensor localization system that is configured to: perform a scan, using a 3D scanner, to collect surface data associated with an autonomous vehicle (AV), analyze the surface data to identify a coordinate origin of the AV, and calculate a position of at least one or more AV sensors based on the surface data. Methods and computer-readable media are also provided.

17 Claims, 6 Drawing Sheets

SENSOR CALIBRATION VIA EXTRINSIC SCANNING

BACKGROUND

1. Technical Field

The subject technology provides solutions for improving sensor calibration, and in particular for performing extrinsic sensor calibration for vehicle sensors, such as environmental sensors deployed in an autonomous vehicle (AV) context.

2. Introduction

Autonomous vehicles (AVs) are vehicles having computers and control systems that perform driving and navigation tasks that are conventionally performed by a human driver. As AV technologies continue to advance, ride-sharing services will increasingly utilize AVs to improve service efficiency and safety. However, for effective deployment, AVs will be required to perform many of the functions that are conventionally performed by human drivers, such as performing navigation and routing tasks. Such tasks may require the collection and processing of large quantities of data using various sensor types, including but not limited to cameras and/or Light Detection and Ranging (LiDAR) sensors disposed on the AV.

BRIEF DESCRIPTION OF THE DRAWINGS

Certain features of the subject technology are set forth in the appended claims. However, the accompanying drawings, which are included to provide further understanding, illustrate disclosed aspects and together with the description serve to explain the principles of the subject technology. In the drawings:

DETAILED DESCRIPTION

Figure 1A:
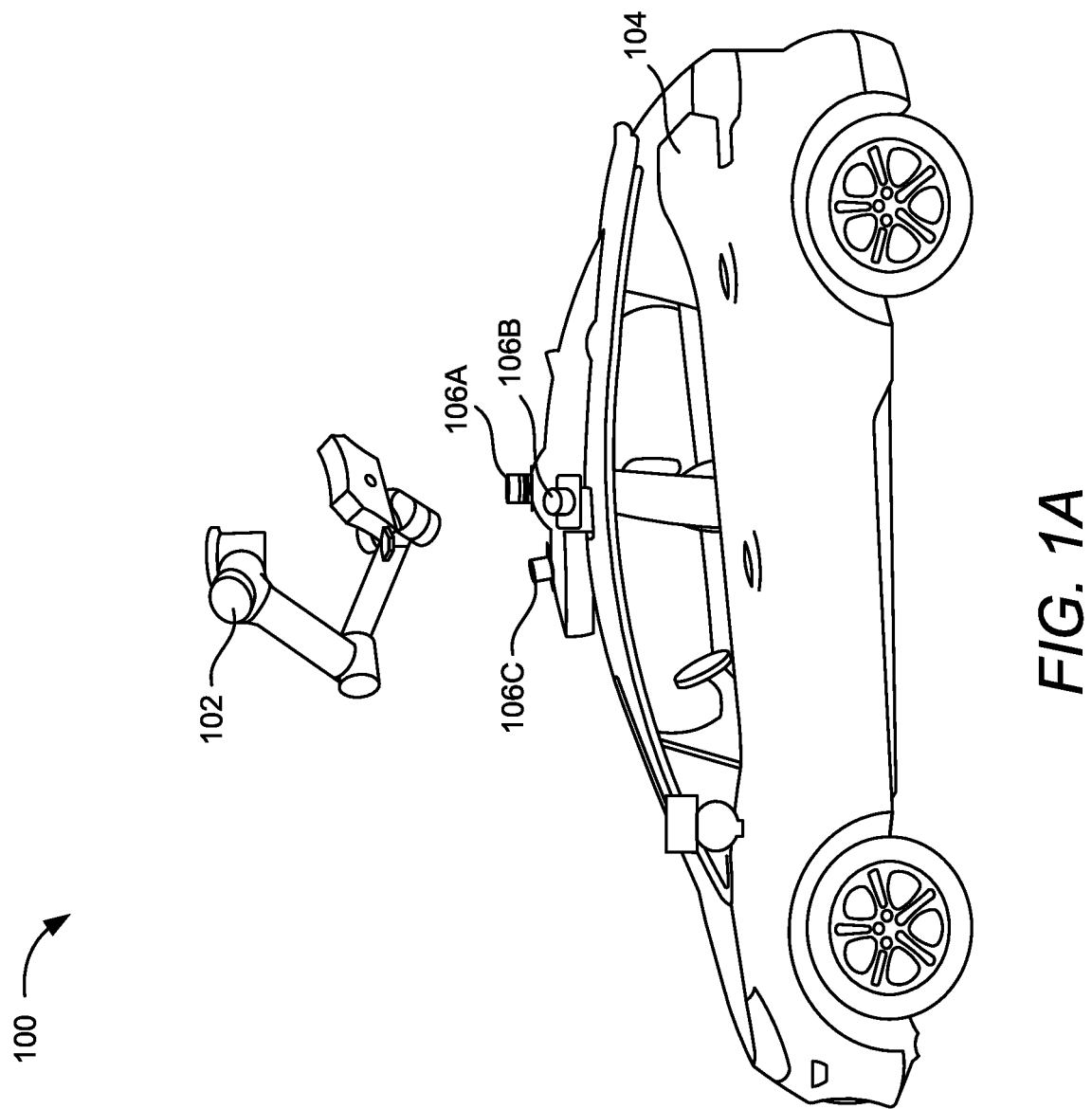
FIG. 1A illustrates an example environment 100 in which a sensor localization system can be implemented, according to some aspects of the disclosed technology.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a more thorough understanding of the subject technology. However, it will be clear and apparent that the subject technology is not limited to the specific details set forth herein and may be practiced without these details. In some instances, structures and components are shown in block diagram form in order to avoid obscuring the concepts of the subject technology.

As described herein, one aspect of the present technology is the gathering and use of data available from various sources to improve quality and experience. The present disclosure contemplates that in some instances, this gathered data may include personal information. The present disclosure contemplates that the entities involved with such personal information respect and value privacy policies and practices.

Autonomous vehicles (AVs) rely on environmental sensors to perform a variety of operations, such as maneuver planning, routing, and navigation. To ensure safety and performance, the environmental sensors (e.g., Light Detection and Ranging (LiDAR), cameras, radar sensors, etc.), are typically calibrated and validated before vehicle deployment. To perform precise calibrations, sensor positions must be accurately known. However, sensor-to-sensor positions can be difficult to determine with a high-degree of accuracy, for example, due to changes in sensor mounting (e.g., due to vehicle collisions or other damage), or due to tolerance errors in manufacturing specifications for different component parts (e.g., error due to tolerance stacking). Additionally, sensor positions can be difficult to determine in retrofitting scenarios, for example, where new sensors are added or used to replace legacy sensors on an already deployed vehicle, or in scenarios where damaged sensors are repaired or replaced.

Aspects of the disclosed technology provide solutions for localizing vehicle sensors to facilitate accurate extrinsic sensor calibration. In some approaches, a coordinate origin of the vehicle (e.g., AV) is identified before performing a three-dimensional (3D) scan of the vehicle's surface. As discussed in further detail below, the identification of a coordinate origin of the vehicle can be accomplished by collecting surface data associate with the AV, and analyzing the surface data to identify the coordinate origin. In other aspects, the coordinate origin may be determined through accurate positioning of the AV, for example, by identifying a location of one or more axels of the vehicle. Depending on the desired implementation, different coordinate origins may be used. By way of example, the center point of the AV's inertial measurement unit (IMU) may be used as a coordinate reference point.

Once the vehicle's coordinate origin has been established, the locations/positions of one or more sensor units can be determined, for example, by performing a second scan, using a 3D scanner, to collect feature data associated with the sensors. As discussed in further detail below, 3D surface scans can be performed with any scanning technology that is configured to collect high-resolution surface/feature data necessary to accurate localize sensor modules. By way of example, the 3D scanner can include the use of stereo cameras with structured light, and/or laser scanning technologies, etc. Collected feature data can be processed (e.g., stitched together) to accurately identify the location and orientation of one or more vehicle sensors (e.g., LiDAR sensors, and cameras, etc.), and used to facilitate extrinsic sensor calibration.

By performing accurate sensor localization through the use of an external scanner, sensor locations can be quickly and accurately ascertained without the need to perform precise vehicle positioning and/or use on-vehicle sensor data. As such, the extrinsic sensor calibration process can be streamlined and better adapted for various use cases, such as sensor retrofits, and repairs, etc.

FIG. 1A illustrates an example environment 100 in which a sensor localization system can be implemented, according to some aspects of the disclosed technology. Environment 100 includes a sensor localization system 102 that is configured to scan a surface of vehicle (AV) 104. Although sensor localization system 102 is shown to be a ceiling mounted device, it is understood that other configurations are contemplated, without departing from the scope of the disclosed technology.

In operation, sensor localization system 102 is configured to perform 3D scans of the surface of AV 104, for example, to localize vehicle 104 and facilitate identification of a vehicle coordinate origin. Although the vehicle origin can be chosen/identified at any point relative to vehicle 104, in some approaches, the origin may be identified as a middle point of the rear vehicle axel, e.g., corresponding with a location of the vehicles IMU (not illustrated).

Once the origin has been identified, one or more 3D scans of the vehicle surface can be performed for example, to identify and localize one or more of the vehicle's sensors such as sensors 106 (e.g., 106A, 106B, 106C). As illustrated in the example of environment 100, sensors 106 are illustrated as LiDAR sensors on a roof of vehicle 104; however it is understood that additional (or fewer) sensors can be implemented, and that the sensor locations and modalities can vary, depending on the AV setup, without departing from the scope of the disclosed technology. In some aspects, localization of the sensors can be performed using 3D image scans generated by scanner 102. As discussed in further detail below with respect to FIG. 2, the resulting 3D image scans can be composites of several images that are stitched together, for example, using visual features or other identifying markers on the vehicle's surface.

Figure 1B:
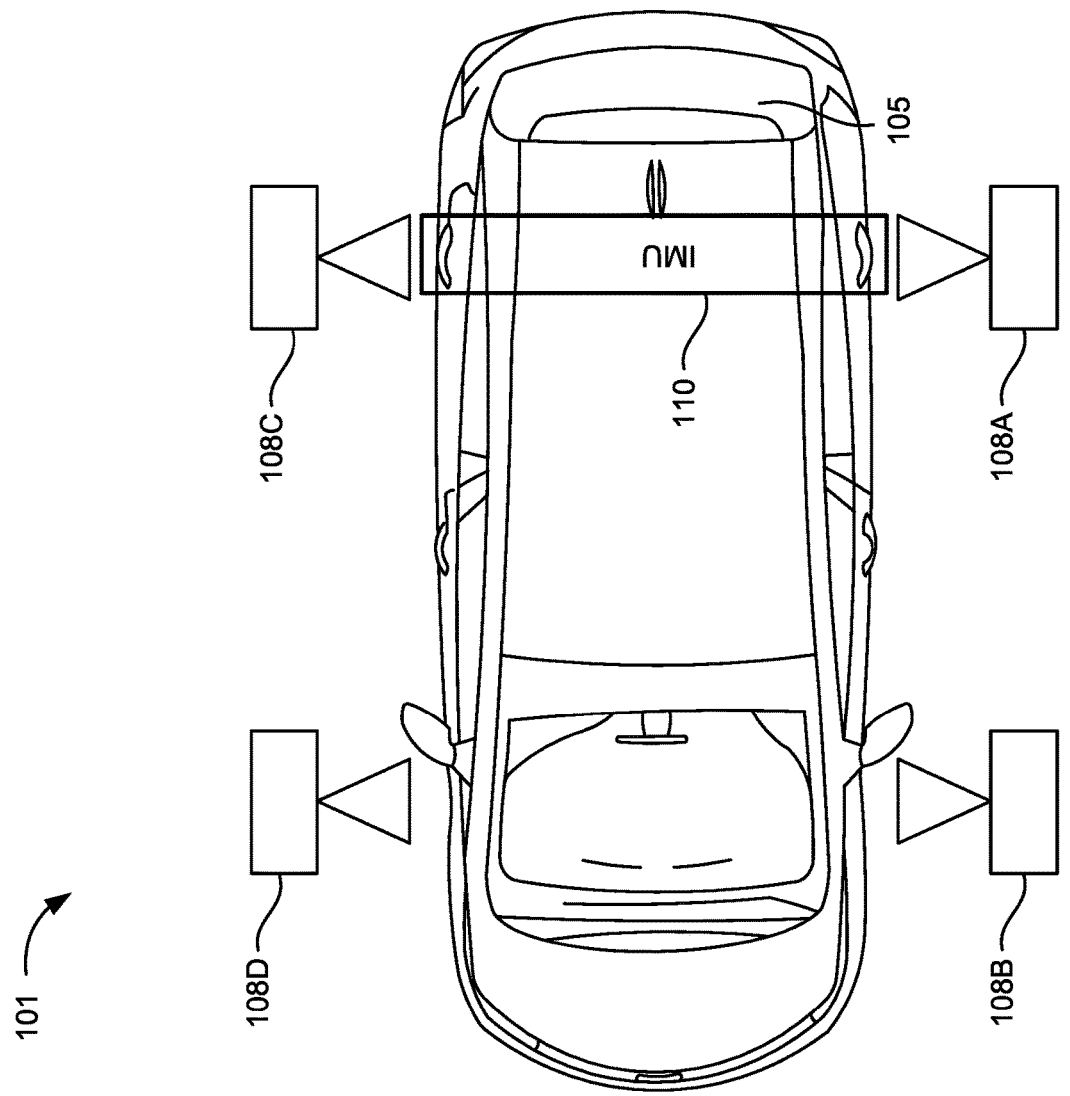
FIG. 1B illustrates an example environment for identifying a vehicle coordinate origin, according to some aspects of the disclosed technology.

FIG. 1B illustrates an example environment 101 for identifying a vehicle coordinate origin, according to some aspects of the disclosed technology. Specifically, environment 101 illustrates a top-perspective view of a vehicle (e.g., an AV) 105 for which vehicle origin determinations are made using a wheel alignment system (WAM) (108), comprising multiple laser scanning stations, e.g., 108A, 108B, 108C, and 108D.

In practice, WAM 108 is configured to collect precise wheel alignment data using one or more laser scanners (108A, 108B, 108C, 108D), that are configured to scan the vehicles wheels to collect suspension and wheel alignment data. Using the suspension and wheel alignment data, precise locations in or around the vehicle can be determined. From the suspension and wheel alignment data, a precise location of the vehicle's Inertial Measurement Unit (IMU) 110 can be determined and used as a vehicle coordinate origin, as discussed above with respect to FIG. 1A.

Figure 2:
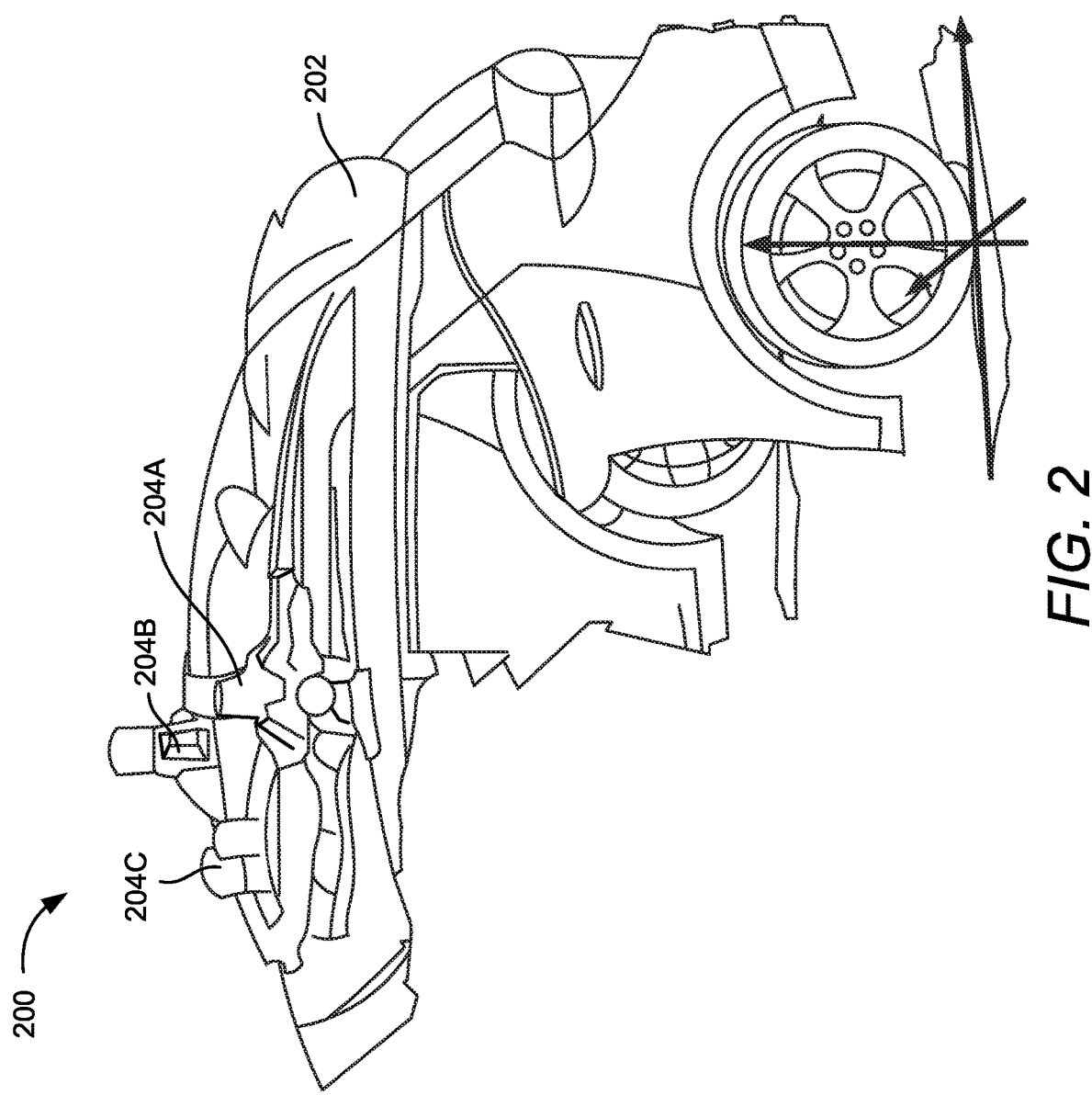
FIG. 2 illustrates an example of a three-dimensional scan of a vehicle surface, according to some aspects of the disclosed technology.

FIG. 2 illustrates an example of a three-dimensional scan 200 of a vehicle surface, according to some aspects of the disclosed technology. As discussed above, scan 200 can be a composite of multiple images or scans taken using a 3D scanner (see FIG. 1A). In some aspects, unique surface features can be used to stitch various individual scans to form composite 3D image representations of a surface of vehicle 202. In the example of scan 200, multiple environmental sensors 204 (e.g., 204A, 204B, 204C) are shown on the roof of vehicle 202. However, additional or (fewer sensors) disposed in additional or different locations, may be identifiable from the scan without departing from the scope of the disclosed technology.

In practice, the resulting 3D scan can be used to localize each sensor (204A, 204B, 204C) with a high degree of accuracy. For example, each sensor (204A, 204B, 204C) can be identified in a three-dimensional coordinate space with respect to a vehicle origin, as discussed above. As such, the 3D scan can be used to provide high accuracy location information for each of the AV's environmental sensors, without the need to perform intrinsic measurements using the vehicle's environmental sensors. By knowing the location of each sensor with precision, extrinsic sensor calibration can be more readily performed, especially in instances where sensor repairs or retrofits are being performed.

Figure 3:
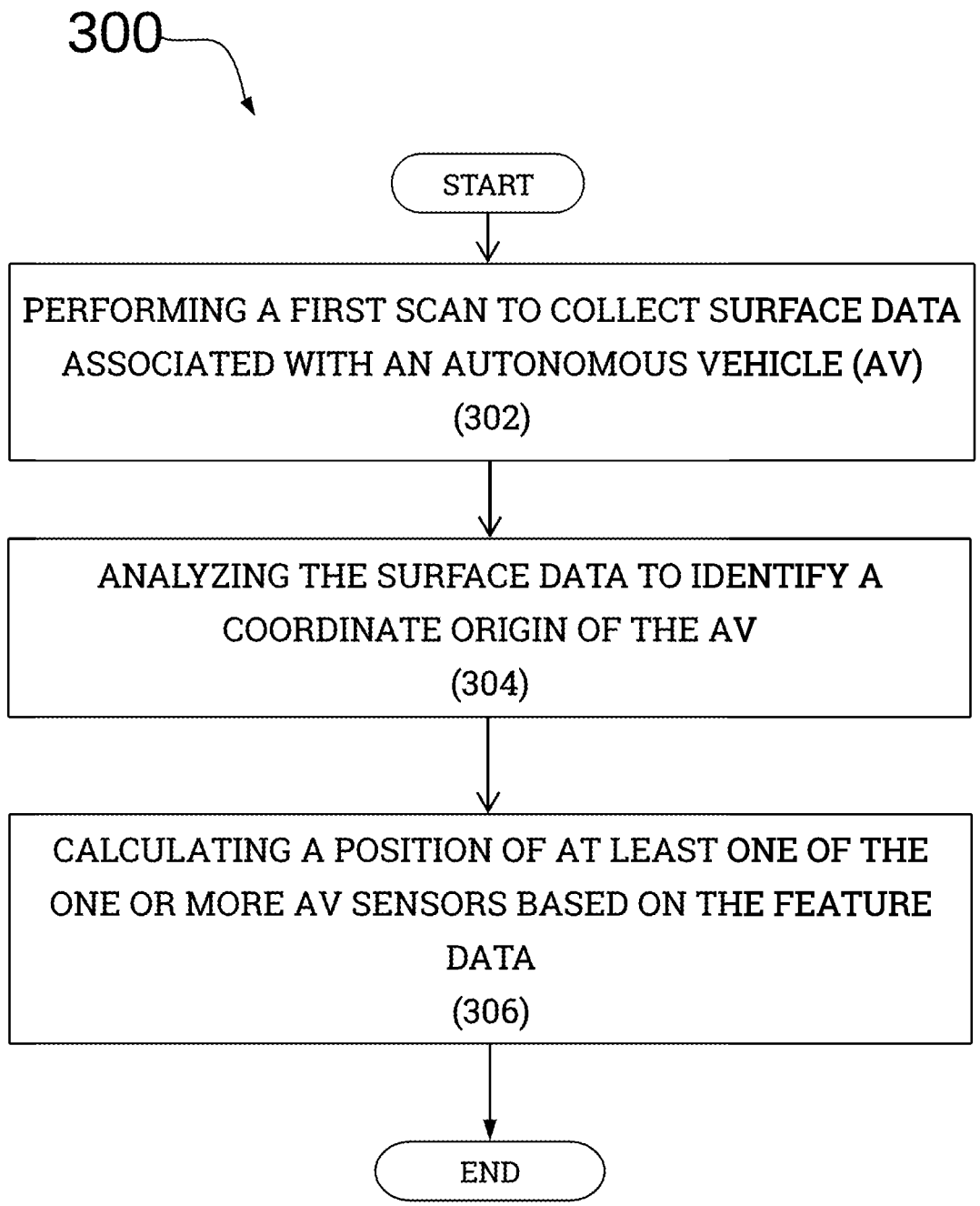
FIG. 3 illustrates an example process for facilitating extrinsic sensor calibration (localization), according to some aspects of the disclosed technology.

FIG. 3 illustrates an example process 300 for facilitating sensor localization, according to some aspects of the disclosed technology. Process 300 beings with step 302 in which a scan is performed using a 3D scanner, e.g., to collect surface data associated with an autonomous vehicle (AV). As discussed above, the 3D scanner can include any type of scanning hardware that can be configured to generate a high-resolution scan of the AV's surface. For example, the 3D scanner can include a stereo camera system that operates using structured (or unstructured) light and/or a laser scanner, etc.

In some aspects, surface data may also be provided or derived from other sources. For example, surface data can include, or may be enhanced by, computer aided design (CAD) data (e.g., drawings and/or specifications) of the AV layout, as well as any other available data regarding various measurements of AV systems, sensors, and/or other features (e.g., the environmental sensors). By way of example, surface data can include data about measurements or specifications regarding one or more AV sensors, such as LiDAR sensors 106 and/or 204 discussed above.

Collection of surface data can be performed in a single scan or with multiple scans, for example, of different portions of the AV surface. As such, the resulting 3D surface scan can be a composite of two or more scan images that are stitched together based on unique or overlapping artifacts or geometries. In some aspect, the scan may benefit from vehicle localization information that is collected using Wheel Alignment Machine (WAM), for example, that is used to collect information about the vehicle's suspension geometry and, for example, to identify a location of the Inertial Measurement Unit (IMU). By way of example, the WAM may be used to accurately identify a location of the AV's IMU along a rear axle. Such information can be used to localize the vehicle, as discussed in further detail below.

In step 304, the surface data is analyzed to identify a coordinate origin of the AV. In some aspects, the coordinate origin may be determined based on known vehicle features/geometries identified from the collected surface data (step 302). As discussed above with respect to FIG. 1B, the vehicle's coordinate origin may also be determined using other types of vehicle positioning information, such as data from the wheel suspension/alignment process, e.g., that is collected using a wheel alignment machine (WAM).

In step 306, a position of at least one of the AV sensors is calculated based on the scan data collected in step 302. Sensor localization can be used to facilitate the sensor calibration process. For example, external sensor localization can provide significant advantages in scenarios where intrinsic sensor calibration data and/or manufacturer specifications cannot be relied upon for accurate positioning. The ability to perform extrinsic sensor localization and calibration operations using the collected surface information can greatly improve the speed and efficiency with which sensor calibrations can be performed, thereby improving the efficiency of performing new sensor installations, repairs, and retrofits.

Figure 4:
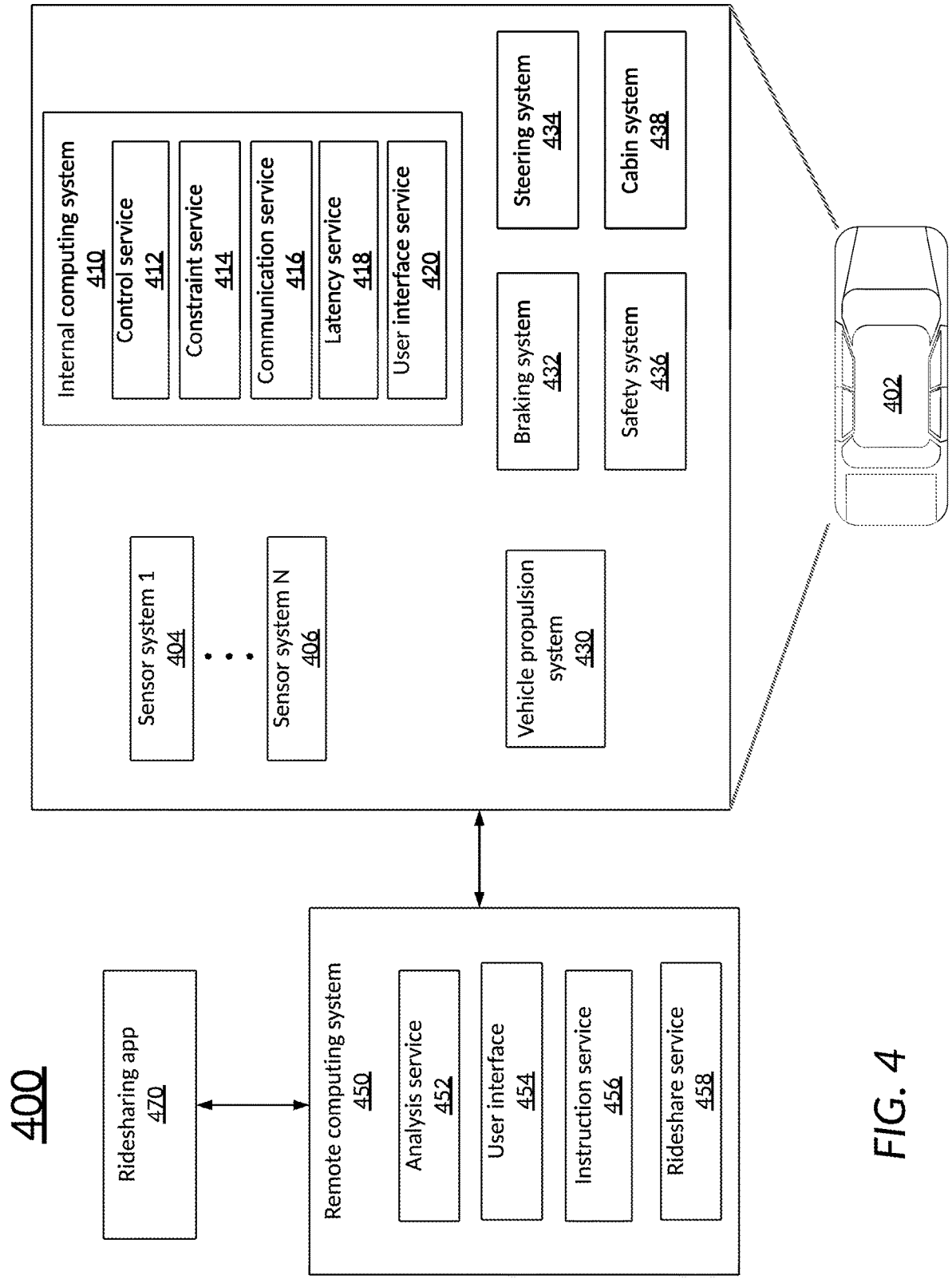
FIG. 4 illustrates an example system environment that can be used to facilitate AV navigation and routing operations, according to some aspects of the disclosed technology.

The disclosure now turns to FIG. 4, which illustrates an example system environment 400 that can be used to facilitate AV dispatch and operations, according to some aspects of the disclosed technology. Autonomous vehicle 402 can navigate about roadways without a human driver based upon sensor signals output by sensor systems 404-406 of autonomous vehicle 402. Autonomous vehicle 402 includes a plurality of sensor systems 404-406 (a first sensor system 404 through an Nth sensor system 406). Sensor systems 404-406 are of different types and are arranged about the autonomous vehicle 402. For example, first sensor system 404 may be a camera sensor system and the Nth sensor system 406 may be a Light Detection and Ranging (LIDAR) sensor system. Other exemplary sensor systems include radio detection and ranging (RADAR) sensor systems, Electromagnetic Detection and Ranging (EmDAR) sensor systems, Sound Navigation and Ranging (SONAR) sensor systems, Sound Detection and Ranging (SODAR) sensor systems, Global Navigation Satellite System (GNSS) receiver systems such as Global Positioning System (GPS) receiver systems, accelerometers, gyroscopes, inertial measurement units (IMU), infrared sensor systems, laser rangefinder systems, ultrasonic sensor systems, infrasonic sensor systems, microphones, or a combination thereof. While four sensors 480 are illustrated coupled to the autonomous vehicle 402, it is understood that more or fewer sensors may be coupled to the autonomous vehicle 402.

Autonomous vehicle 402 further includes several mechanical systems that are used to effectuate appropriate motion of the autonomous vehicle 402. For instance, the mechanical systems can include but are not limited to, vehicle propulsion system 430, braking system 432, and steering system 434. Vehicle propulsion system 430 may include an electric motor, an internal combustion engine, or both. The braking system 432 can include an engine brake, brake pads, actuators, and/or any other suitable componentry that is configured to assist in decelerating autonomous vehicle 402. In some cases, braking system 432 may charge a battery of the vehicle through regenerative braking. Steering system 434 includes suitable componentry that is configured to control the direction of movement of the autonomous vehicle 402 during navigation. Autonomous vehicle 402 further includes a safety system 436 that can include various lights and signal indicators, parking brake, airbags, etc. Autonomous vehicle 402 further includes a cabin system 438 that can include cabin temperature control systems, in-cabin entertainment systems, etc.

Autonomous vehicle 402 additionally comprises an internal computing system 410 that is in communication with sensor systems 480 and systems 430, 432, 434, 436, and 438. Internal computing system 410 includes at least one processor and at least one memory having computer-executable instructions that are executed by the processor. The computer-executable instructions can make up one or more services responsible for controlling autonomous vehicle 402, communicating with remote computing system 450, receiving inputs from passengers or human co-pilots, logging metrics regarding data collected by sensor systems 480 and human co-pilots, etc.

Internal computing system 410 can include a control service 412 that is configured to control operation of vehicle propulsion system 430, braking system 432, steering system 434, safety system 436, and cabin system 438. Control service 412 receives sensor signals from sensor systems 480 as well communicates with other services of internal computing system 410 to effectuate operation of autonomous vehicle 402. In some embodiments, control service 412 may carry out operations in concert one or more other systems of autonomous vehicle 402. Internal computing system 410 can also include constraint service 414 to facilitate safe propulsion of autonomous vehicle 402. Constraint service 414 includes instructions for activating a constraint based on a rule-based restriction upon operation of autonomous vehicle 402. For example, the constraint may be a restriction upon navigation that is activated in accordance with protocols configured to avoid occupying the same space as other objects, abide by traffic laws, circumvent avoidance areas, etc. In some embodiments, the constraint service can be part of control service 412.

The internal computing system 410 can also include communication service 416. The communication service 416 can include both software and hardware elements for transmitting and receiving signals from/to the remote computing system 450. Communication service 416 is configured to transmit information wirelessly over a network, for example, through an antenna array that provides personal cellular (long-term evolution (LTE), 3G, 4G, 5G, etc.) communication.

Internal computing system 410 can also include latency service 418. Latency service 418 can utilize timestamps on communications to and from remote computing system 450 to determine if a communication has been received from the remote computing system 450 in time to be useful. For example, when a service of the internal computing system 410 requests feedback from remote computing system 450 on a time-sensitive process, the latency service 418 can determine if a response was timely received from remote computing system 450 as information can quickly become too stale to be actionable. When the latency service 418 determines that a response has not been received within a threshold, latency service 418 can enable other systems of autonomous vehicle 402 or a passenger to make necessary decisions or to provide the needed feedback.

Internal computing system 410 can also include a user interface service 420 that can communicate with cabin system 438 in order to provide information or receive information to a human co-pilot or human passenger. In some embodiments, a human co-pilot or human passenger may be required to evaluate and override a constraint from constraint service 414, or the human co-pilot or human passenger may wish to provide an instruction to the autonomous vehicle 402 regarding destinations, requested routes, or other requested operations.

As described above, the remote computing system 450 is configured to send/receive a signal from the autonomous vehicle 440 regarding reporting data for training and evaluating machine learning algorithms, requesting assistance from remote computing system 450 or a human operator via the remote computing system 450, software service updates, rideshare pickup and drop off instructions, etc.

Remote computing system 450 includes an analysis service 452 that is configured to receive data from autonomous vehicle 402 and analyze the data to train or evaluate machine learning algorithms for operating the autonomous vehicle 402. The analysis service 452 can also perform analysis pertaining to data associated with one or more errors or constraints reported by autonomous vehicle 402. Remote computing system 450 can also include a user interface service 454 configured to present metrics, video, pictures, sounds reported from the autonomous vehicle 402 to an operator of remote computing system 450. User interface service 454 can further receive input instructions from an operator that can be sent to the autonomous vehicle 402.

Remote computing system 450 can also include an instruction service 456 for sending instructions regarding the operation of the autonomous vehicle 402. For example, in response to an output of the analysis service 452 or user interface service 454, instructions service 456 can prepare instructions to one or more services of the autonomous vehicle 402 or a co-pilot or passenger of the autonomous vehicle 402. Remote computing system 450 can also include rideshare service 458 configured to interact with ridesharing applications 470 operating on (potential) passenger computing devices. The rideshare service 458 can receive requests to be picked up or dropped off from passenger ridesharing app 470 and can dispatch autonomous vehicle 402 for the trip. The rideshare service 458 can also act as an intermediary between the ridesharing app 470 and the autonomous vehicle wherein a passenger might provide instructions to the autonomous vehicle to 402 go around an obstacle, change routes, honk the horn, etc. Remote computing system 450 can, in some cases, include at least one computing system 450 as illustrated in or discussed with respect to FIG. 5, or may include at least a subset of the components illustrated in FIG. 5 or discussed with respect to computing system 450.

Figure 5:
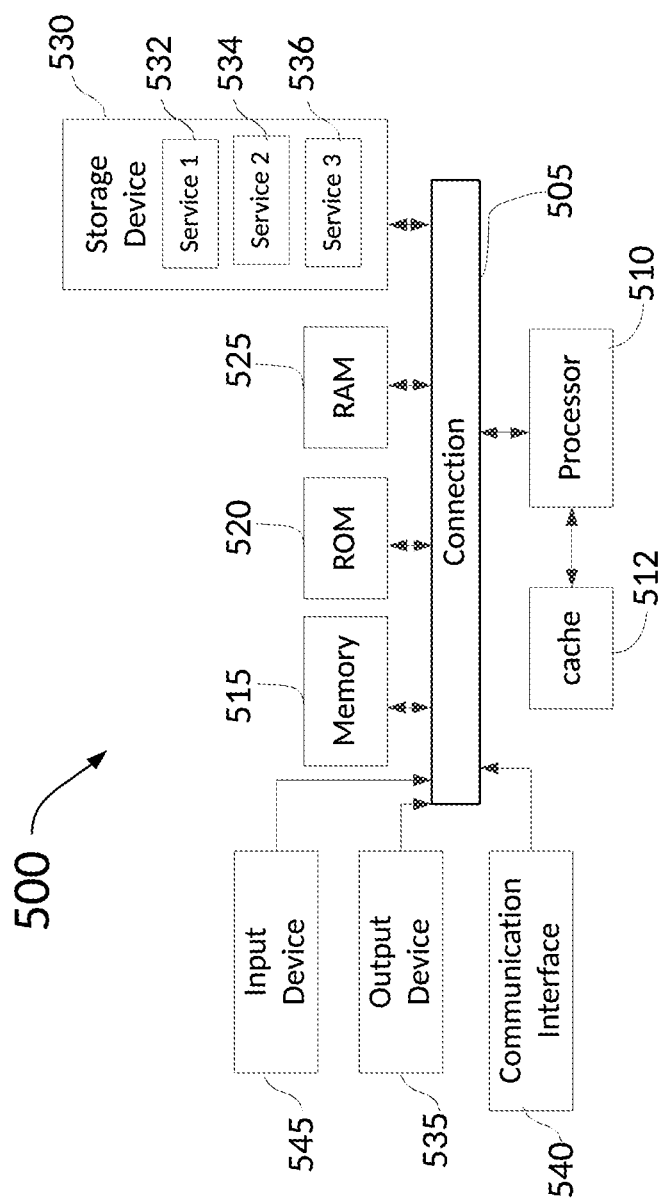
FIG. 5 illustrates an example processor-based system with which some aspects of the subject technology can be implemented.

FIG. 5 illustrates an example processor-based system with which some aspects of the subject technology can be implemented. For example, processor-based system 500 that can be any computing device making up internal computing system 110, remote computing system 150, a passenger device executing the rideshare app 170, internal computing system 110, or any component thereof in which the components of the system are in communication with each other using connection 505. Connection 505 can be a physical connection via a bus, or a direct connection into processor 510, such as in a chipset architecture. Connection 505 can also be a virtual connection, networked connection, or logical connection.

In some embodiments, computing system 500 is a distributed system in which the functions described in this disclosure can be distributed within a datacenter, multiple data centers, a peer network, etc. In some embodiments, one or more of the described system components represents many such components each performing some or all of the function for which the component is described. In some embodiments, the components can be physical or virtual devices.

Example system 500 includes at least one processing unit (CPU or processor) 510 and connection 505 that couples various system components including system memory 515, such as read-only memory (ROM) 520 and random-access memory (RAM) 525 to processor 510. Computing system 500 can include a cache of high-speed memory 512 connected directly with, in close proximity to, and/or integrated as part of processor 510.

Processor 510 can include any general-purpose processor and a hardware service or software service, such as services 532, 534, and 536 stored in storage device 530, configured to control processor 510 as well as a special-purpose processor where software instructions are incorporated into the actual processor design. Processor 510 may essentially be a completely self-contained computing system, containing multiple cores or processors, a bus, memory controller, cache, etc. A multi-core processor may be symmetric or asymmetric.

To enable user interaction, computing system 500 includes an input device 545, which can represent any number of input mechanisms, such as a microphone for speech, a touch-sensitive screen for gesture or graphical input, keyboard, mouse, motion input, speech, etc. Computing system 500 can also include output device 535, which can be one or more of a number of output mechanisms known to those of skill in the art. In some instances, multimodal systems can enable a user to provide multiple types of input/output to communicate with computing system 500. Computing system 500 can include communications interface 540, which can generally govern and manage the user input and system output. The communication interface may perform or facilitate receipt and/or transmission wired or wireless communications via wired and/or wireless transceivers, including those making use of an audio jack/plug, a microphone jack/plug, a universal serial bus (USB) port/plug, an Apple® Lightning® port/plug, an Ethernet port/plug, a fiber optic port/plug, a proprietary wired port/plug, a BLUETOOTH® wireless signal transfer, a BLUETOOTH® low energy (BLE) wireless signal transfer, an IBEACON® wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, 3G/4G/5G/LTE cellular data network wireless signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

Communication interface 540 may also include one or more Global Navigation Satellite System (GNSS) receivers or transceivers that are used to determine a location of the computing system 500 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 530 can be a non-volatile and/or non-transitory computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a Blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (L1/L2/L3/L4/L5/L#), resistive random-access memory (RRAM/ReRAM), phase change memory (PCM), spin transfer torque RAM (STT-RAM), another memory chip or cartridge, and/or a combination thereof.

Storage device 530 can include software services, servers, services, etc., that when the code that defines such software is executed by the processor 510, it causes the system to perform a function. In some embodiments, a hardware service that performs a particular function can include the software component stored in a computer-readable medium in connection with the necessary hardware components, such as processor 510, connection 505, output device 535, etc., to carry out the function.

As understood by those of skill in the art, machine-learning based classification techniques can vary depending on the desired implementation. For example, machine-learning classification schemes can utilize one or more of the following, alone or in combination: hidden Markov models; recurrent neural networks; convolutional neural networks (CNNs); deep learning; Bayesian symbolic methods; general adversarial networks (GANs); support vector machines; image registration methods; applicable rule-based system. Where regression algorithms are used, they may include including but are not limited to: a Stochastic Gradient Descent Regressor, and/or a Passive Aggressive Regressor, etc.

Machine learning classification models can also be based on clustering algorithms (e.g., a Mini-batch K-means clustering algorithm), a recommendation algorithm (e.g., a Miniwise Hashing algorithm, or Euclidean Locality-Sensitive Hashing (LSH) algorithm), and/or an anomaly detection algorithm, such as a Local outlier factor. Additionally, machine-learning models can employ a dimensionality reduction approach, such as, one or more of: a Mini-batch Dictionary Learning algorithm, an Incremental Principal Component Analysis (PCA) algorithm, a Latent Dirichlet Allocation algorithm, and/or a Mini-batch K-means algorithm, etc.

Embodiments within the scope of the present disclosure may also include tangible and/or non-transitory computer-readable storage media or devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform tasks or implement abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hardwired links, wireless links, or by a combination thereof) through a communications network. In a distributed computing environment, program modules can be located in both local and remote memory storage devices.

The various embodiments described above are provided by way of illustration only and should not be construed to limit the scope of the disclosure. For example, the principles herein apply equally to optimization as well as general improvements. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

What is claimed is:

1. A sensor localization system, comprising:
    one or more processors;
    a three-dimensional (3D) scanner coupled to the one or more processors; and
    a computer-readable medium coupled to the processors, the computer-readable medium comprising instructions stored therein, which when executed by the processors, cause the processors to perform operations comprising:
        performing a scan, using the 3D scanner, to collect surface data associated with an autonomous vehicle (AV);
        analyzing the surface data to identify a coordinate origin of the AV, wherein the coordinate origin is identified based on a location of an inertial measurement unit (IMU) of the AV; and
        calculating a position of at least one or more AV sensors based on the surface data by determining a coordinate location of the at least one of the one or more AV sensors based on the coordinate origin of the AV.

2. The sensor localization system of claim 1, wherein analyzing the surface data to identify the coordinate origin for the AV further comprises:
    automatically identifying one or more or more known vehicle geometries.

3. The sensor localization system of claim 1, wherein performing the scan, further comprises:
    receiving a plurality of images of the AV surface; and
    stitching the plurality of images to generate a three-dimensional image of the AV surface.

4. The sensor localization system of claim 1, wherein the surface data further includes computer aided design (CAD) modeling information for the one or more AV sensors.

5. The sensor localization system of claim 1, wherein the 3D scanner comprises a stereo camera.

6. The sensor localization system of claim 1, wherein the 3D scanner comprises one or more lasers.

7. The sensor localization system of claim 1, wherein the one or more AV sensors comprises a Light Detection and Ranging (LiDAR) sensor.

8. A computer-implemented method comprising:
performing a scan, using a 3D scanner, to collect surface data associated with an autonomous vehicle (AV);
analyzing the surface data to identify a coordinate origin of the AV, wherein the coordinate origin is identified based on a location of an inertial measurement unit (IMU) of the AV; and
calculating a position of one or more AV sensors based on the surface data by determining a coordinate location of the one or more AV sensors based on the coordinate origin of the AV.

9. The computer-implemented method of claim 8, wherein analyzing the surface data to identify the coordinate origin for the AV further comprises:
automatically identifying one or more or more known vehicle geometries.

10. The computer-implemented method of claim 8, wherein performing the scan, further comprises:
receiving a plurality of images of the AV surface; and
stitching the plurality of images to generate a three-dimensional image of the AV surface.

11. The computer-implemented method of claim 8, wherein the surface data further includes computer aided design (CAD) modeling information for the one or more AV sensors.

12. The computer-implemented method of claim 8, wherein the 3D scanner comprises a stereo camera.

13. The computer-implemented method of claim 8, wherein the 3D scanner comprises one or more lasers.

14. A non-transitory computer-readable storage medium comprising instructions stored therein, which when executed by one or more processors, cause the processors to perform operations comprising:
performing a scan, using a 3D scanner, to collect surface data associated with an autonomous vehicle (AV);
analyzing the surface data to identify a coordinate origin of the AV, wherein the coordinate origin is identified based on a location of an inertial measurement unit (IMU) of the AV; and
calculating a position of one or more AV sensors based on the surface data by determining a coordinate location of at least one of the one or more AV sensors based on the coordinate origin of the AV.

15. The non-transitory computer-readable storage medium of claim 14, wherein analyzing the surface data to identify the coordinate origin for the AV further comprises:
automatically identifying one or more or more known vehicle geometries.

16. The non-transitory computer-readable storage medium of claim 14, wherein performing the scan, further comprises:
receiving a plurality of images of the AV surface; and
stitching the plurality of images to generate a three-dimensional image of the AV surface.

17. The non-transitory computer-readable storage medium of claim 14, wherein the surface data further includes computer aided design (CAD) modeling information for the one or more AV sensors.

* * * * *